United States Patent [19]

Harrison

[11] Patent Number: 4,488,230
[45] Date of Patent: Dec. 11, 1984

[54] PROGRAMMED LOGIC ARRAY WITH EXTERNAL SIGNALS INTRODUCED BETWEEN ITS AND PLANE AND ITS OR PLANE

[75] Inventor: Marc L. Harrison, Morganville, N.J.

[73] Assignee: AT&T Bell Laboratories, Murray Hill, N.J.

[21] Appl. No.: 505,994

[22] Filed: Jun. 20, 1983

Related U.S. Application Data

[63] Continuation-in-part of Ser. No. 448,001, Dec. 8, 1982.

[51] Int. Cl.³ .............................................. G06F 9/22
[52] U.S. Cl. .................................. 364/200; 364/716; 307/465; 340/825.83
[58] Field of Search ... 364/200 MS File, 900 MS File, 364/716, 715; 340/825.79, 825.83, 825.85, 825.86, 825.87; 307/465, 466, 467, 468, 469, 463

[56] References Cited

U.S. PATENT DOCUMENTS

| | | | |
|---|---|---|---|
| 3,593,289 | 7/1971 | Lerch et al. | 340/825.83 |
| 3,974,366 | 8/1976 | Hebenstreit | 364/716 |
| 4,032,894 | 6/1977 | Williams | 340/825.83 |
| 4,034,356 | 7/1977 | Howley et al. | 307/465 |
| 4,124,899 | 11/1978 | Birkner et al. | 364/716 |
| 4,399,516 | 8/1983 | Blahut et al. | 364/716 |
| 4,409,499 | 10/1983 | Zapisek et al. | 364/716 |
| 4,415,818 | 11/1983 | Ogawa et al. | 340/825.83 |
| 4,429,238 | 1/1984 | Harrison | 307/465 |

OTHER PUBLICATIONS

J. C. Logue et al., "PLA Test Enhancement", IBM Tech. Discl. Bull., vol. 23, No. 3, Aug. 1980, pp. 1116-1117.

D. A. Kluga, "Clocked PLA w/Dummy Circuit Forming Clock Pulse for Inter-Array Driver w/Worst-Case Delay", IBM T.D.B., vol. 24, No. 6, Nov. 1981.

Howley et al., "Programmable Logic Array Decoding Technique", IBM Tech. Discl. Bull., vol. 17, No. 10, Mar. 1975, p. 2988.

E. Hebenstreit et al., "High-Speed Programmable Logic Arrays in ESFI SOS Technology", *IEEE Journal of Solid-State Circuits*, vol. SC-11, Jun. 1976, pp. 370-374.

R. H. Krambeck et al., "High-Speed Compact Circuits with CMOS", *IEEE Journal of Solid-State Circuits*, vol. SC-17, Jun. 1982, pp. 614-619.

C. Mead et al., *Introduction to VLSI Systems*, 1980, pp. 75-84.

*Primary Examiner*—Raulfe B. Zache
*Assistant Examiner*—William G. Niessen
*Attorney, Agent, or Firm*—David I. Caplan

[57] ABSTRACT

A combinational logic device, such as an AND gate, is connected to control the flow of information along a wordline from the AND plane to the OR plane of a PLA (programmed logic array). To each such combinational logic device is applied an input signal from a source external to the PLA, so that the PLA's output can respond relatively quickly to this input signal—that is, the PLA is capable of relatively quick decision making.

3 Claims, 6 Drawing Figures

PROGRAMMED LOGIC ARRAY WITH EXTERNAL SIGNALS INTRODUCED BETWEEN ITS AND PLANE AND ITS OR PLANE

CROSS-REFERENCE TO RELATED APPLICATION

This application is a continuation-in-part of co-pending application Ser. No. 448,001, filed in the United States on Dec. 8, 1982, entitled "PLA-Based Finite State Machine With Two-Level Control Timing and Same-Cycle Decision-Making Capability."

FIELD OF THE INVENTION

This invention relates to electronic data processing systems and more particularly to programmed logic arrays (PLAs).

BACKGROUND OF THE INVENTION

Logic arrays are used in digital data processing systems to perform logic calculation or transformations; that is, to process data by furnishing data signal outputs which are determined by data signal inputs in accordance with prescribed logic transformation rules. For this purpose, programmed logic arrays (PLAs) provide an easily designed and well-structured alternative to random (individually distributed) combinatorial (or "combinational") logic devices. The advantages of a PLA stem from its compact integrated circuit layout and its ease of systematic design once the desired logic transformation rule or function (PLA's output vs. input) or "characteristic table" is prescribed. Also, because of a PLA's patterned array structure, redefinition of its logical transformation function can be as easily accomplished as modification of a conventional ROM (Read Only Memory) array, i.e., by modification of the pattern of array crosspoints at which cross-connecting elements or links are present vs. absent.

Internally, a conventional PLA comprises two logic array portions known as the AND plane (also known as the DECODER array portion) and the OR plane (also known as the ROM array portion). The AND and the OR planes are often realized by a pair of separate logic arrays each implementing a NOR function, since an AND followed by an OR function is logically equivalent to a NOR followed by a NOR function. The AND and OR planes are electrically connected together by paths or lines known as interconnecting (or intermediate) wordlines, say n in number. During operation, a sequence of PLA binary input data signal combinations is entered into the AND plane on a plurality of input signal lines, say N in number, in order to furnish a sequence of binary input combinations of input words—for example, each word formed by a binary bit string, such as (1,0,1 . . . 0,1,0), or binary digital bits, N in number—and a sequence of PLA binary output data signals or output words emanates in response thereto from the OR plane on a plurality of output signal lines, say P in number. When the PLA is adapted for use as a finite state machine, one or (typically) more of the binary output signals from the OR plane can be fed back as input bits to the AND plane. Both AND and OR planes, in certain specific embodiments, comprise orthogonal row and column lines mutually intersecting at crosspoints; and at each of the crosspoints is situated or is not situated a crosspoint cross-connecting link such as a transistor, depending upon the desired logic transformation function of the PLA.

The binary signal on a line carrying data in the PLA can be either logic HIGH, representing the binary digital bit ONE ("1"), or else logic LOW, representing the binary digital bit ZERO ("0"). Ordinarily, any given intermediate wordline (between AND and OR planes) will be logic HIGH (binary ONE or 1) if and only if the input word introduced on the input lines of the AND plane is a member of a set of given input words corresponding to that wordline. In a specific example, for purpose of illustration, the given intermediate wordline will be logic HIGH if and only if the input word is the bit string characterized by the first bit ($I_1$) being logic HIGH ($I_1=1$), and the second bit ($I_2$) being logic LOW ($I_2=0$), and the third bit ($I_3$) being logic HIGH ($I_3=1$), . . . and the last bit ($I_N$) being logic LOW; that is, if and only if $I_1=1$ and $I_2=0$ and $I_3=1$ . . . and $I_N=0$, where N is the number of bits in the input word and hence $I_N$ is the last (N'th) bit. On the other hand, the output signal on a given output line (a given output bit) emanating from the OR plane is logic LOW if and only if any one or more of a given group of intermediate wordlines is logic HIGH, that is, for a specific example, if and only if the first wordline ($W_1$) is logic HIGH, or the third wordline ($W_3$) is logic HIGH, or the sixth wordline ($W_6$) is logic HIGH; that is, the given output bit is ZERO when and only when $W_1=1$ or $W_3=1$ or $W_6=1$. In this way, the PLA supplies output words, each of length P, which are (Boolean) functions of the input words, each of length N.

In ordinary operation with a PLA, it is desired that the PLA should handle many input words in sequence, one input word after another; that is, the PLA should perform its prescribed transformation on many words of input data, one input word after another, and should deliver its corresponding output words in sequence, one output word after another. Accordingly, the PLA is supplied with data shifting means (shift registers) for repetitively temporarily storing and shifting (transferring) data into, through, and out of, the PLA—all in accordance with a suitable timing sequence, so as to avoid confusion of one word or set of data (say, old data) with another (say, new data) in the PLA. Moreover, the PLA must be able to receive each new input word and to deliver each new output word at appropriate respective moments of time or during appropriate time intervals, according to the system requirements of the rest of the data processing system in which the PLA operates. Such system requirements typically are "synchronous"; that is, the PLA receives data from and delivers data to the rest of the system in response to (periodic) clock control timing, typically in the form of a sequence of clock pulses. In such a case, ordinarily the PLA can receive input data only during a first predetermined portion or phase of each cycle (period) of the clock control, and the PLA can deliver output data only during a second predetermined (in general, different) portion or phase of each such cycle of the clock. For example, if the clock has two phases ($\phi_1$, $\phi_2$) per cycle, then the PLA typically receives input data during one of the phases ($\phi_1$) and delivers output data during the other of the phases ($\phi_2$) of each cycle. Accordingly, the rate at which the PLA processes (receives and delivers) data is inversely proportional to the clock cycle time or period T of the control clock and is directly proportional to the clock frequency $f=1/T$.

The data shifting means required in a PLA ordinarily takes the form of a pair of clocked parallel registers for temporarily storing periodically shifting data. Each register typically takes the form of a group of flip-flop devices (each device being a pair of crosscoupled inverters, the output of one inverter being the input of the other) mutually arranged in parallel, that is, so that each entire binary word being processed by the PLA can be transferred (shifted) into, temporarily stored in, and transferred out of the register—all in response to a single clock cycle of the control timing supplied to the registers. The pair of registers is ordinarily connected and supplied with control timing so as to operate in a "master-slave" relationship, that is, one of the registers serving as the "master" register and the other as its "slave." By definition, the master receives data from an external source (such as another register) and its slave receives data from its master, all in response to control timing arranged so that when one of the registers (master or slave) can receive new data the other cannot.

Thus, for example, during a first phase of a cycle of the clock used to control the timing of both master and slave, data can enter into the master register but not into its slave, and during a second phase of the control cycle, data is shifted (entered) from the master into its slave register but then no data can enter into the master.

The U.S. patent application Ser. No. 448,002, filed by M. E. Thierbach on Dec. 8, 1982, entitled "Programmed Logic Array With Two-Level Control Timing," teaches that a PLA can operate at a faster rate of speed than in prior art (or can be built of larger size, and hence larger data handling capacity, and operate at the same rate) by inserting a pair of parallel registers in master-slave relationship on the intermediate wordline between the AND and OR planes of the PLA. The PLA then operates with two-level control timing; that is, data circulate through the PLA in two cycles of the control timing used to control the registers, rather than in one cycle as in prior art. On the other hand, although the PLA can then operate to yield output data at the faster rate, the time required for data to circulate through the PLA does not correspondingly decrease but remains essentially the same because it takes the two cycles of control timing for data to circulate through the PLA operating with two-level control timing.

U.S. Pat. No. 4,399,516 issued to D. E. Blahut et al on Aug. 16, 1983 entitled "Stored Program Control Machine," teaches that advantage can be gained when an input signal for an input register of a PLA is gated by a combinational logic device (such as an AND gate) with a WAIT signal. That is, for example, a HIGH level of input signal cannot be latched by the input register when the WAIT signal goes LOW ("unready"). When single-level control timing of the PLA registers is used as described in the aforementioned Blahut et al application, that is, when data circulate through the PLA in one cycle, then, if the WAIT signal goes "unready" at the beginning of a given clock cycle, the "unready" signal affects the output of the PLA at the end of the (same) given cycle. However, when a PLA operates with two-level control timing in accordance with the above-mentioned Thierbach application, then the "unready" signal affects the output of the PLA at the end of the second cycle (immediately following the first cycle) but does not affect the output of the PLA at the end of the first cycle. Thus a delay or time lag of a full cycle occurs before the "unready" signal affects the output of the PLA operating with two-level control timing. Accordingly, the output of the PLA in a given cycle cannot respond in a given cycle to a WAIT signal available for the PLA in the same cycle, but only to a WAIT signal available in the previous cycle. In other words, the PLA lacks a desirable same-cycle input-to-output response, i.e., same-cycle decision-making capability, in response to the WAIT signal.

The U.S. patent application Ser. No. 446,343, filed by M. L. Harrison et al on Dec. 2, 1982, entitled "PLA-Based Finite State Machine With Combinational Logic Control of Input Register Thereof" teaches that in certain cases the size of a PLA implementing a finite state machine (i.e., with feedback from output to input of the PLA) can be reduced, and hence its speed of operation can be increased, by inserting a combinational logic device (such as an AND gate) to gate (or "stop") the clock control signal of the input register of the AND plane of a PLA in response to an "unready" level of a WAIT signal applied to an input terminal of the logic device. Such cases arise where it is desired that the feedback state of the PLA should remain the same (should be "frozen"), because the rest of the system is not ready to supply new input data to the PLA or to utilize new output data from the PLA. Thus, for example, if at the commencement of a given cycle of single-level control timing (data circulate through the PLA in one cycle), the WAIT signal goes "unready", then the state of the machine of the previous cycle persists without change throughout the given cycle; that is, the machine is frozen beginning with the same cycle as at the beginning of which the "unready" signal is available. However, when a PLA operates with two-level control timing in accordance with the above-mentioned Thierback application, then the state of the machine will not be frozen beginning with the same cycle. Instead, when an "unready" signal is applied at the beginning of a given cycle, then the state of the machine as of the next (future) cycle will be frozen—that is, the state of the machine (at the end) of the present cycle will in general be different from that (at the end) of the previous cycle, and only the state of the next cycle (as well as of still later cycles if the "unready" signal persists) will be the same as that of the present cycle. Thus, a delay or time lag of a full cycle occurs after commencement of the "unready" signal before the machine is frozen. Such a lag constitutes an undesirable delay in those cases where the "unready" signal signifies present unreadiness, for example, present unavailability of input to the PLA from the rest of the system. The PLA thus lacks a desirable same-cycle decision-making capability with respect to freezing in response to the WAIT signal. It would therefore also be desirable to have a means for freezing without delay a PLA implementing a finite state machine using two-level control timing, that is, for freezing the PLA feedback state during the same cycle in which the "unready" signal is available for application to the PLA.

Also, a similar problem arises in the case of a PLA with single-level control timing, i.e., a PLA which requires just one cycle for data to circulate through the PLA—such as, for example, the PLA described in a paper by E. Hebenstreit et al, entitled "High-Speed Programmable Logic Arrays in ESFI SOS Technology," published in *IEEE Journal of Solid-State Circuits*, Vol. SC-11, pp. 370–374 (1976), at p. 371. In such a case, an input signal for a given cycle of a PLA may not be available at the PLA (from a source of the input signal external to the PLA) until slightly after the beginning of that cycle and hence too late to be received by the input register of the PLA for response and utilization by the PLA during that cycle. Accordingly, it would be desirable to have a means for enabling a PLA operating with single-level control-timing to respond to such a late input signal during the same PLA cycle, that is, for enabling same-cycle response or decision-making in response to late arriving input signals.

SUMMARY OF THE INVENTION

This invention involves a PLA having an input signal line, which brings in an external signal as input to the PLA, connected to a logic element or device which is connected so as to control the flow of information from the AND plane to the OR plane of the PLA along a wordline between these planes. In this way, the PLA can have same-cycle response with respect to an external signal which arrives too late during an operation cycle for processing during that cycle by the AND plane but not too late for processing during that cycle by the OR plane.

In one embodiment, a PLA operating with single-level control timing has a logic device, such as a switching transistor, on at least one of its intermediate wordlines whereby the flow of data from the AND plane to the OR plane of the PLA can be interrupted by an external input signal applied to the logic device.

In another embodiment, the invention involves a PLA with two-level clock control timing having single-cycle (or "one-cycle") decision-making capability in response to a WAIT signal as input to the PLA. Typically, when the WAIT signal goes LOW ("unready") at the beginning of a clock cycle of the control timing, then the output of the PLA (including feedback) is affected thereby during the same clock cycle. In order to accomplish this single-cycle decision-making capability, the WAIT signal is applied directly to a combinational logic device, such as an AND gate, which is connected so as to control a flow of output data from a slave register of a pair of registers in master-slave relationship connected on the wordlines between AND and OR planes of the PLA. In this way, the slave register receives its wordline input data from its master register and delivers its wordline output data to the OR plane under the control of the WAIT signal, while a PLA output register delivers PLA output data which can be affected by the WAIT signal within the same clock cycle as that during which the WAIT signal is available.

For example, in order for a PLA implementing a finite state machine with two-level control timing to be capable of being frozen without any delay, that is, as soon as (i.e., within the same cycle) an "unready" signal is available, the control timing for a slave register, in the master-slave register pair connected on the wordlines between AND and OR planes of the PLA, is gated by a combinational logic device. The combinational logic device can take the form of an AND gate whose inputs include the (ungated) clock control timing for the slave register and the WAIT signal, the WAIT signal being low ("unready") when the PLA is to be frozen and being HIGH otherwise.

In a specific embodiment of the invention a PLA which implements a finite state machine includes an AND plane and an OR plane with intermediate wordlines therebetween. A pair of parallel registers in master-slave relationship is connected on the wordlines in order to receive data from the AND plane and deliver data to the OR plane, an input parallel register is connected to the AND plane's input end in order to deliver data to the AND plane, and an output parallel register is connected to the OR plane's output end in order to receive data from the OR plane. The output register is also connected to deliver data to other portions of a data processing system in which the PLA operates, as well as to deliver data to the input register. The input register is also connected to receive data from still other portions of the system, as well as from the output register. The input register, the output register, and the pair of registers in master-slave relationship connected on the wordlines are all controlled as to timing by two-level periodic control timing, except that the control timing for the slave register of the pair of registers connected on the wordlines is not periodic but instead is derived from an output terminal of an AND gate. An input terminal of the AND gate is connected to receive a periodic clock pulse sequence. Another input terminal of the AND gate is connected to a WAIT signal line which delivers a LOW level ("unready") signal when the PLA is to be frozen and a HIGH level ("ready") signal otherwise. The output terminal of this AND gate is connected to the slave register, in order to supply it with gated control timing—and thereby directly to control a flow of data into the slave register, and hence to control the flow of data from the OR plane to the AND plane—in a manner suitable for freezing the PLA within the same cycle as that cycle at the commencement of which the "unready" signal is applied.

In another specific embodiment, the AND gate is connected as follows: one input terminal thereof to receive output of the slave register, another input terminal to receive the WAIT signal, and an output terminal thereof to a wordline emanating from the slave register and entering the OR plane of the PLA. In this way, the AND gate directly controls the flow of data on the wordline from the slave register to the OR plane in such a manner that the PLA output can respond to (can be affected by) the WAIT signal within the same cycle as that during which the "unready" signal is applied.

BRIEF DESCRIPTION OF THE DRAWING

This invention together with its advantages, features, and objects may be better understood from the following detailed description in which.

DETAILED DESCRIPTION

Figure 1:
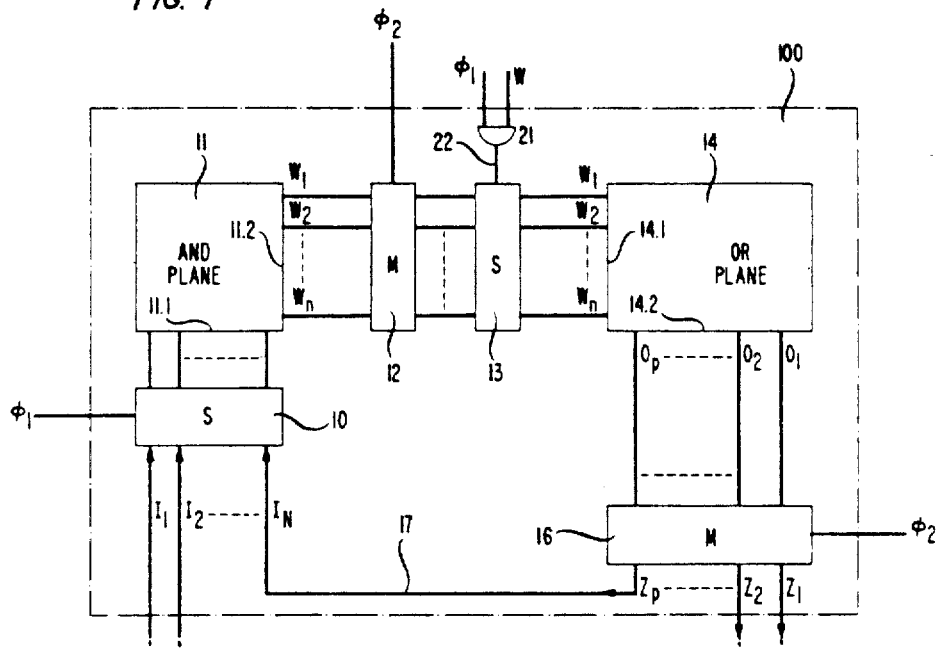
FIG. 1 is a diagram of a PLA, implementing a finite state machine, with two-level control timing in accordance with a specific embodiment of the invention.

Referring to FIG. 1, a PLA 100 includes an input register 10, an AND plane 11, intermediate wordlines $W_1, W_2, \ldots W_n$, a master register 12 and a slave register 13 connected on these wordlines, an OR plane 14 with output lines $O_1, O_2, \ldots O_P$, and an output register 16. Each register typically comprises an array of clock controlled transmission gates for periodically delivering incoming data to an array of latches, as more fully described below. The output register 16 has output signal lines $Z_1, Z_2, \ldots Z_P$. The input register 10 has input signal lines $I_1, I_2, \ldots I_N$. At least one output line $Z_P$ is connected by a feedback signal line 17 to an input line $I_N$ in order to implement a finite state machine.

Figure 2:
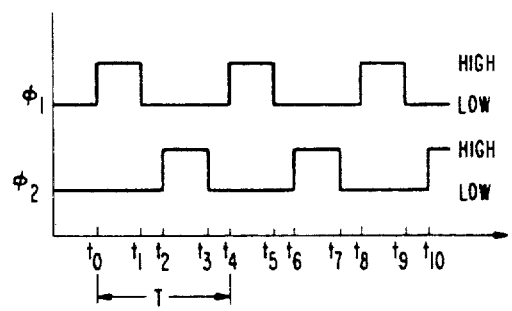
FIG. 2 is a diagram of control timing useful in the embodiment of FIG. 1.

Control timing for the input register 10 is supplied by a first clock pulse sequence $\phi_1$. Control timing for the master register 12, as well as for the output register 16, is supplied by a second clock pulse sequence $\phi_2$. Both sequences $\phi_1$ and $\phi_2$ are described in greater detail below in conjunction with FIG. 2. Control timing for the slave register 13 is supplied by a control line 22 connected to the output terminal of an AND gate 21. The output of the AND gate is HIGH if and only if both of its inputs are HIGH. The AND gate 21 has an input terminal supplied with the first clock sequence $\phi_1$ and another input terminal supplied with a WAIT signal W. The WAIT signal W is HIGH ("ready") when it is desired that the PLA 100 should operate normally, that is, should progress from one state to the next during each clock cycle period T (FIG. 2). The WAIT signal W is LOW ("unready") when it is desired that the state of the PLA 100 should be frozen, that is, should remain in the same state for more than one cycle and for as long thereafter as the WAIT signal W remains LOW. The "unready" signal level of the WAIT signal W thus stops the reception by the slave register 13 of any data (from the wordlines), until the "ready" level of the WAIT signal resumes.

The input register 10 is connected to receive and latch data from the input lines $I_1, I_2, \ldots I_N$ in response to control timing or clocking supplied by a first periodic clock pulse sequence $\phi_1$, of periodicity T, comprising alternating HIGH and LOW levels (pulses), as indicated in FIG. 2 for example. During time intervals corresponding to the HIGH levels or phases ($t_0t_1, t_4t_5, t_8t_9, \ldots$), the input register is transparent to its input data; during time intervals corresponding to the LOW phase ($t_1t_4, t_5t_8, \ldots$), the input register latches these data. By "transparent" is meant that the latches (not shown) in the register can then receive fresh (new) data flowing (incoming) to the register. The input register 10 delivers its output data to the AND plane 11 along N input lines to the input side 11.1 thereof. Thus the input register 10 typically is formed by a parallel shift register having N parallel stages and one serial stage, each such stage comprising a $\phi_1$ clock controlled transmission gate for periodically delivering (incoming) data to a latch.

The AND plane 11 is essentially a crosspoint array of horizontal lines, n in number, and vertical lines, N in number. The AND plane 11 is connected to receive data at its input side (or input end) 11.1 emanating along N vertical lines from the input register 10, and to deliver data (as transformed by the AND plane) to the intermediate wordlines $W_1, W_2, \ldots W_n$. At each crosspoint of the AND plane is connected or is not connected an operative link such as a transistor, depending upon the desired transformation function of this AND plane, as described in greater detail, for example, in the book by C. Mead et al entitled *Introduction to VLSI Systems*, at pages 81–82 (1980), or in the aforementioned paper by E. Hebenstreit et al.

The master register 12 is connected to receive and latch data from the intermediate wordlines $W_1, W_2, \ldots W_n$ emanating from an output side (or output end) 11.2 of the AND plane 11. The master register 12 can latch these data in response to control timing supplied by a second clock pulse sequence $\phi_2$, also of periodicity T, comprising alternating HIGH and LOW levels (pulses), as indicated in FIG. 2 for example. During time intervals corresponding to HIGH levels or phases ($t_2t_3, t_6t_7, \ldots$) of the second clock pulse sequence $\phi_2$, the master register 12 is transparent to its (wordline) input (incoming) data; during the LOW levels of $\phi_2$, the master register 12 latches these data. Thus the master register 12 typically is formed by a parallel shift register having n parallel stages and one serial stage.

The slave register 13 is connected to receive and latch data from its master register 12. The slave register 13 can latch these (wordline input) data in response to control timing supplied by an AND gate 21 on control line 22 connected to the output terminal of such AND gate. During time intervals when this control line 22 is HIGH, the slave register 13 is transparent to data (from its master); when the control line 22 is LOW, the slave register 13 latches the data. Thus the slave register 13 typically is formed by a parallel shift register having n parallel stages.

Advantageously, the slave register 13 is a static register, that is, each of its stages includes (in addition to a transmission gate) a static latch which can store data for many cycles T, that is, for at least as many cycles T as the longest duration of time during which the WAIT signal W (and hence the control line 22) remains LOW during operation. In this way, when the WAIT signal remains LOW for many cycles, and hence when the state of the PLA 100 is to be frozen for many cycles, data is not lost.

The slave register 13 is connected to deliver its (wordline) output data along wordlines $W_1, W_2, \ldots W_n$ into the input side or end 14.1 of the OR plane 14. Thus, the WAIT signal W directly controls the flow of data into the slave register 13 and thereby controls the flow of data from the AND plane 11, through the master and slave registers 12 and 13, to the OR plane 14 along the wordlines $W_1, W_2, \ldots W_n$.

The OR plane 14 is constructed similarly to the AND plane 11, except that the OR plane has n horizontal lines and P vertical lines. The OR plane has each of its crosspoints supplied, or not supplied, with an operative link such as an operative transistor, depending upon the desired transformation function of the OR plane, as described in greater detail in the aforementioned book by C. Mead et al or the aforementioned paper by E. Hebenstreit et al.

The output register 16 is connected to receive and latch data emanating along P (vertical) output lines $O_1, O_2, \ldots O_P$ from the OR plane 14. The output register 16 can latch these data in response to control timing supplied by the second clock pulse sequence $\phi_2$, that is, according to the same timing as that of the master register 12. Thus, the output register 16 can latch data (from the OR plane 14) only during the same time intervals during which the master register 12 can latch data from the AND plane 11. Accordingly, the output register 16 typically is formed by a parallel register having P parallel stages and one serial stage.

The output register 16 can continuously deliver its PLA output data signals along output lines $Z_1, Z_2, \ldots Z_P$, and one or more of these output signals become input for the input register 10 by virtue of feedback path(s). Feedback line 17, for example, supplies a feedback path for output signal $Z_P$ which becomes input signal $I_N$. Such a feedback path enables the PLA 100 to implement a finite state machine. Typically, there is more than one such feedback path.

During operation, the input register 10 is transparent to data from input lines $I_1, I_2, \ldots I_n$ during those phases or time intervals when the first clock sequence $\phi_1$ is HIGH such as ($t_0t_1$). These data are transformed by the AND plane 11 and periodically received by the latches in the master register 12 during subsequent phases or time intervals when the second clock sequence $\phi_2$ is HIGH (such as $t_2t_3$). Next, these data are received by the latches in the slave register 13 from the master register 12 during HIGH phases of the first clock sequence $\phi_1$ (such as $t_0t_1$ and $t_4t_5$) only if the WAIT signal W is then HIGH; otherwise the latches in the slave register 13 retain old data received from the master register 12 during a previous cycle. The data from the slave register are transformed by the OR plane and are periodically received by the latches in the output register 16 during subsequent time intervals when the second sequence $\phi_2$ is HIGH (such as $t_6t_7$). Some of the data from the output register 16 are fed back to and received by the latches in the input register 10 on one or more feedback lines during all subsequent time intervals when the first sequence $\phi_1$ is HIGH (such as $t_4t_5$ and $t_8t_9$). Thus, if the LOW or "unready" level of the WAIT signal W is applied to the AND gate 21 at the commencement of the "present" cycle, say $t_4t_8$, then the latches in the slave register 13 (substantially immediately) cannot receive any new data during this same cycle $t_4t_8$ (assuming the "unready" level persists throughout $t_4t_5$). Therefore, the slave register 13 continues to deliver the same data to the OR plane 14 during the present cycle $t_4t_8$ as it did during the previous cycle $t_0t_4$. Accordingly, the output register 16 receives the same data during the HIGH phase ($t_6t_7$) of the second clock sequence $\phi_2$ during the present cycle as it did during the HIGH phase ($t_2t_3$) thereof during the previous cycle. Thus, as desired, the output register 16 delivers the same feedback during a later portion of the present cycle (beginning at $t_6$, and thereafter continuing at least until $t_{10}$) as it did during a later portion (beginning at $t_2$) of the previous cycle $t_0t_4$ (and continuing through the earlier portion $t_4t_6$ of the present cycle $t_4t_8$).

It should be understood that in certain cases the safety margin against a "race-through" (premature shifting of data by registers) condition—as is afforded by nonvanishing time intervals $t_1t_2, t_3t_4, t_5t_6, t_7t_8 \ldots$ (when both sequences $\phi_1$ and $\phi_2$ are LOW)—is not required, for example, because of suitable selection of threshold levels of transistors used as transmission gates for the registers. In such cases, the safety margin can be reduced to zero, and thus the clock sequences $\phi_1$ and $\phi_2$ can be reduced to $\phi$ and $\bar{\phi}$, i.e., complementary clock pulse sequences each having HIGH and LOW phases of equal duration.

The input register 10, the master register 12, and the output register 16 can each be formed by static or by dynamic parallel stages, depending upon the system parameters and requirements.

Figure 3:
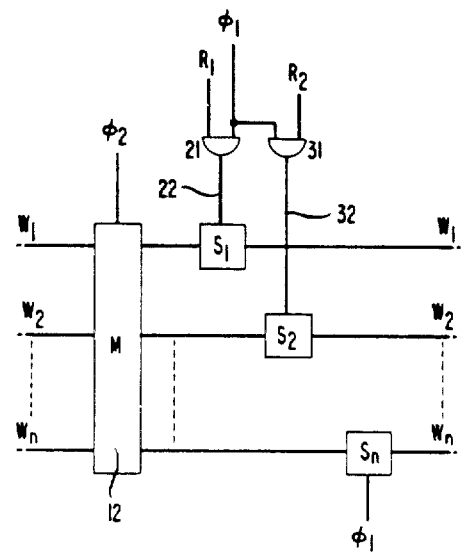
FIG. 3 is a diagram of a portion of a PLA with two-level control timing in accordance with another specific embodiment of the invention.

As indicated in FIG. 3, different portions of the slave register (as formed by different groups of its parallel stages) connected on the wordlines $W_1, W_2, \ldots W_n$ of the otherwise identical PLA 100 can have different control timing supplied by different control lines 22, 32 ... For example, the control timing on control line 22 for the topmost slave register portion of stage $S_1$ can be supplied by the first clock sequence $\phi_1$ gated by the AND gate 21 with a first WAIT signal $R_1$ (which can be the same as the WAIT signal W in FIG. 1); the control timing on control line 32 for the next-to-topmost slave register portion or stage $S_2$ can be supplied by the first clock sequence $\phi_1$ gated by another AND gate 31 with a second, different WAIT signal $R_2$; and the control timing for the bottom-most slave register portion or stage $S_n$ can simply be the first clock sequence $\phi_1$ itself (ungated). In this way, the WAIT signals $R_1, R_2 \ldots$ control the flow of data from the AND plane 10 to the OR plane 14, through the master and slave registers 12 and 13, along the wordlines $W_1, W_2 \ldots$.

Figure 4:
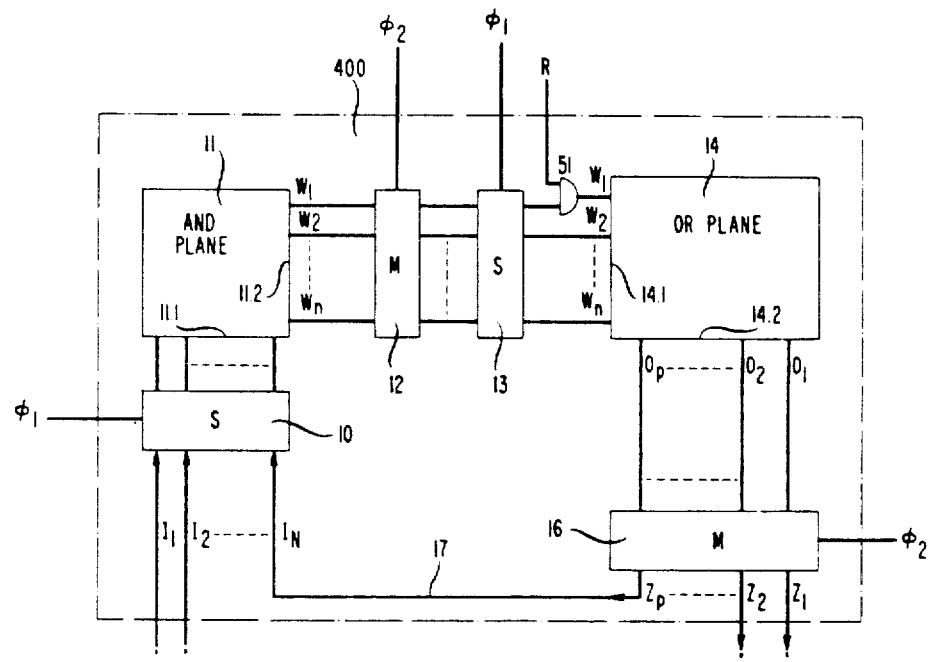
FIG. 4 is a diagram of a PLA, implementing a finite state machine, with two-level control timing in accordance with yet another specific embodiment of the invention.

Referring to FIG. 4, a PLA 400 includes a combinational logic device, such as an AND gate 51, inserted in the path of data flowing from the slave register 13 to the input end 14.1 of the OR plane 14, in order to control the data flow from the slave register to the AND plane in response to a WAIT signal R. Elements of the PLA 400 of FIG. 4 which are similar or identical to those of the PLA 100 of FIG. 1 are denoted by the same reference numerals. The timing of the slave register 13 can be controlled directly by the first sequence $\phi_1$ or, alternatively, by the first sequence AND gated with the WAIT signal W (or WAIT signals $R_1, R_2 \ldots$) as described above in connection with FIG. 1 (or FIG. 3). By thus placing the AND gate 51 (FIG. 4) in the path of data flow from the slave register 13 to the OR plane 14, the flow of data into the output register 16 is affected sooner by the WAIT signal R than would be the case where the AND gate 51 would be placed in one of the input lines $I_1, I_2, \ldots I_n$ of the input register 10. Thus, for example, if the WAIT signal is a flag signal, then the output of the PLA 400 is affected by the flag signal before the end of the same cycle at the beginning of which the flag signal goes LOW, rather than at the end of the next cycle as would be the case where the AND gate 51 would be placed on an input line of the input register 10. Accordingly, the outputs (including feedback) of the PLA 400, as well as of the PLA 100, respond to the WAIT signal during the same cycle as that during which the WAIT signal goes LOW ("unready"). Thus both the PLA 100 and the PLA 400 are characterized by same-cycle decision-making capability.

Figure 5:
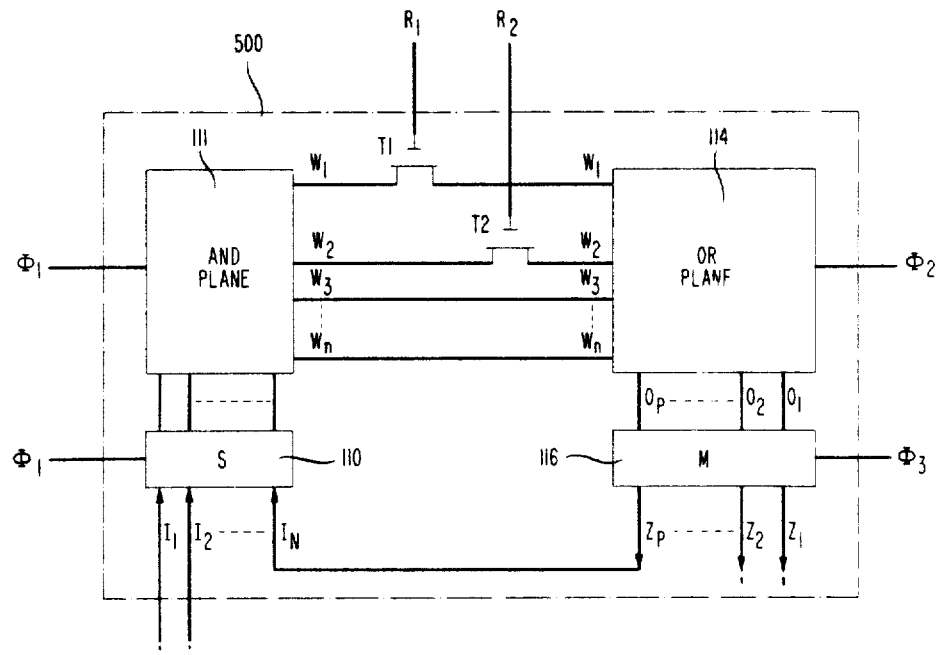
FIG. 5 is a diagram of a PLA, implementing a finite state machine, with single-cycle control timing in accordance with yet another specific embodiment of the invention.

Referring to FIG. 5, a PLA 500 has an AND plane 111 and an OR plane 114. Each plane is constructed in the form of a domino CMOS logic stage (absent output inverters), that is, with NMOS crosspoint driver transistors, PMOS pull-up precharge transistors, and NMOS pull-down ground switch transistors, as known in the art and as more fully described in detail, for example, in the aforementioned paper by E. Hebenstreit et al, or in a paper by R. H. Krambeck et al entitled "High-Speed Compact Circuits with CMOS," published in *IEEE Journal of Solid State Circuits*, Vol. SC-17, pp. 614–619 (1982), or in a pending patent application by H. S. Law entitled "Programmed Logic Array with Auxiliary Pull-up Means to Increase Precharging Speed," Ser. No. 483,645, filed Apr. 11, 1983.

Figure 6:
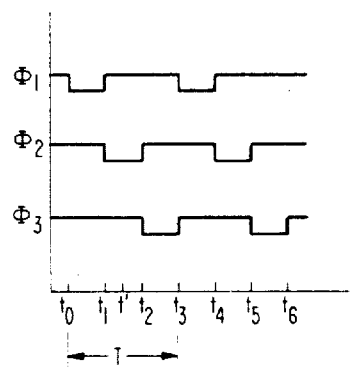
FIG. 6 is a diagram of control timing useful in the embodiment of FIG. 5.

The PLA 500 has an input register 110 and an output register 116, both of which have their transmission gates in the form of PMOS transistors. The control timing sequences for these PMOS transistors in the registers 110 and 116, as well as for the PMOS pull-up transistors in the AND and OR planes 111 and 114, are shown in FIG. 6. Elements of FIG. 5 which have similar functions as corresponding elements in FIG. 1 are thus given the same reference numbers as those of FIG. 1 plus 100.

The gate electrodes of the PMOS transistors serving as transmission gates in the input register 110 are all connected to and controlled by a first clock pulse sequence $\Phi_1$ (FIG. 6). Thus, the input register 110 can receive input signals $I_1, I_2, \ldots I_N$ only during the time intervals $t_0t_1$, $t_4t_5$, etc., that is, during those time intervals when the first sequence $\Phi_1$ is in its LOW phase.

The pull-up transistor in the AND plane 111 is also controlled by the first sequence $\Phi_1$, so that this AND plane precharges only during the time intervals $t_0t_1$, $t_4t_5$, etc. Thus the time intervals $t_0t_1$, $t_4t_5$, etc., are precharging phases of the AND plane. The pull-up transistors in the OR plane 114 are controlled by a second sequence $\Phi_2$, so that this OR plane precharges only during the time intervals $t_1t_2$, $t_5t_6$, etc.—that is, the OR plane precharges during time intervals immediately following precharging phases of the AND plane. The timing of the output register 116 is controlled by a third sequence $\Phi_3$, so that this output register can receive output signals $O_1, O_2, \ldots O_P$ from the OR plane 114 only during the time intervals $t_2t_3$, $t_6t_7$, etc., that is, only during time intervals immediately following precharging phases of this OR plane.

It should be noted that, as illustrated in FIG. 6, an active (LOW) phase of the second sequence $\Phi_2$, for example, begins at $t_2$, that is, at the very same moment of time when an active (LOW) phase of the first sequence $\Phi_1$ ends. In other words—contrary to the situation depicted in FIG. 2 with safety margins therein of durations $t_1t_2$, $t_3t_4$, $t_5t_6$, $t_7t_8$, $t_9t_{10}$—there are no safety margins shown in the timing sequence $\Phi_1$, $\Phi_2$, and $\Phi_3$, as illustrated in FIG. 6. However, it should be understood that safety margins are indeed useful and can be introduced into the sequences $\Phi_1$, $\Phi_2$, and $\Phi_3$ in FIG. 6, as by inserting additional intermediate clock phases for the added margin phases. Only for the sake of simplification, these safety margins have been omitted in FIG. 6.

The AND plane 111 is connected to the OR plane 114 by intermediate wordlines $W_1, W_2, \ldots W_n$. Each of one or more of these wordlines, $W_1$ and $W_2$ for example, has a switching transistor, $T_1$ and $T_2$ for example, each of which can be OFF or ON in order to interrupt or to enable, respectively (and thus to gate), the flow of information along this wordline from the AND to the OR plane in response to corresponding ready signals, $R_1$ and $R_2$ for example, respectively.

Both $T_1$ and $T_2$ are typically NMOS transistors. Thus, for example, when $R_1$ is HIGH, $T_1$ is ON and information can flow along wordline $W_1$ from the AND to the OR plane. But when $R_1$ is LOW, $T_2$ is OFF and information cannot flow along this wordline $W_1$ to the OR plane. Thus, transistor $T_1$ acts as an AND gate with one input on wordline $W_1$ from the AND plane and another input $R_1$ from an external source (not shown), together with an output or wordline $W_1$ to the CR plane.

During operation for the cycle T (FIG. 6), logic computation by the AND plane 111 is performed during the time interval $t_1t_2$—i.e., beginning at $t_1$ (when precharge of this AND plane ends) and ending at $t_2$ (when precharge of the OR plane ends and hence also when logic computation of the OR plane 114 begins). In turn, logic computation of the OR plane 114 is performed during the time interval $t_2t_3$.

During operation, therefore, for a given cycle T (FIG. 6), data inputs $I_1, I_2, \ldots I_N$ being received by the input register 110 should preferably be valid for the given cycle beginning at a moment of time before the end of the time interval $t_0t_1$—in order to ensure arrival of these inputs at the driver transistors of the AND plane 111 by the time $t_1$, even in the presence of circuit delays, especially those delays occasioned by nonvanishing capacitive loading in both the input register 110 and the AND plane 114. At $t_1$, the logic computation of the AND plane begins. Similarly, data inputs being received by the OR plane 114 along the wordlines $W_1$, $W_2, \ldots W_n$ should be valid for that cycle T beginning at a moment of time t' before the end of the time interval $t_1t_2$. Thus if a signal such as $R_1$ or $R_2$ is available at the PLA within interval $t_1t_2$ before this moment of time t', then such signal has indeed arrived in time for proper utilization by the OR plane 114 although not in time for proper utilization by the AND plane 110 (since t' is not before $t_1$).

For good operation, it is preferred that the capacitive loading on any wordline, such as $W_1$ or $W_2$, that contains a switching transistor, such as $T_1$ or $T_2$ (to gate the information flow from AND to OR plane), be smaller by a factor of about two or more in the portion of such wordline contained within the OR plane than in the portion thereof contained within the AND plane, in order to ensure delivery of sufficient charge to the corresponding transistor driver(s) on that wordline in the OR plane. Otherwise, the switching transistor should be replaced by an ordinary combinational logic AND gate, which would have its own driver sufficient to deliver sufficient charge to the driver(s) in the OR plane.

Although the invention has been described in terms of specific embodiments, various modifications can be made without departing from the scope of the invention. Instead of AND gates, as known in the art, NOR gates, NAND gates, OR/INVERT gates, or other gates (with or without inverters) can be used whose inputs are the complements of the WAIT signal and of the clock timing sequence, whereby an overall AND gate logic function is performed.

What is claimed is:

1. A PLA comprising an AND plane, an OR plane, and a plurality of intermediate wordlines running from the AND plane to the OR plane, and having at least one transistor for modifying during operation of the PLA a flow of data from the AND to the OR plane along at least one of the wordlines, said one of the wordlines consisting of first and second lines interconnected by the source-drain path of the transistor, an intermediate signal line being connected to an input terminal of the transistor for delivering thereto an input signal from a source external to the PLA, whereby during operation of the PLA when the input signal on the intermediate signal line is a WAIT signal the flow of data along said one of the wordlines is interrupted by the transistor.

2. The PLA of claim 1 in which the transistor is an MOS transistor and the input terminal is the gate terminal of the transistor.

3. The PLA of claim 1 further comprising an input register connected for delivering data to the AND plane, an output register for receiving data from the OR plane, and at least one feedback line connected for feeding back data from the OR to the AND plane.

* * * * *